(12) United States Patent
Wallace et al.

(10) Patent No.: US 7,877,072 B2
(45) Date of Patent: *Jan. 25, 2011

(54) SYSTEM AND METHOD FOR ADAPTIVELY CONTROLLING RECEIVER GAIN SWITCH POINTS

(75) Inventors: Ray Wallace, El Cajon, CA (US); Ed Corn, Vista, CA (US)

(73) Assignee: Kyocera Corporation, Kyoto (JP)

( * ) Notice: Subject to any disclaimer, the term of this patent is extended or adjusted under 35 U.S.C. 154(b) by 784 days.

This patent is subject to a terminal disclaimer.

(21) Appl. No.: 11/765,220

(22) Filed: Jun. 19, 2007

(65) Prior Publication Data

US 2007/0243842 A1    Oct. 18, 2007

Related U.S. Application Data

(62) Division of application No. 10/829,806, filed on Apr. 22, 2004, now Pat. No. 7,248,847.

(51) Int. Cl.
*H04B 1/06* (2006.01)

(52) U.S. Cl. ............... 455/232.1; 455/234.1; 455/67.11

(58) Field of Classification Search ... 455/232.1–253.2, 455/226.1–226.4, 67.11–67.14
See application file for complete search history.

(56) References Cited

U.S. PATENT DOCUMENTS

| | | | |
|---|---|---|---|
| 5,507,023 A * | 4/1996 | Suganuma et al. | ....... 455/234.1 |
| 5,732,341 A | 3/1998 | Wheatley, III | |
| 5,758,271 A | 5/1998 | Rich et al. | |
| 5,812,607 A | 9/1998 | Hutchinson, IV et al. | |
| 6,052,566 A * | 4/2000 | Abramsky et al. | ....... 455/67.11 |
| 6,101,179 A | 8/2000 | Soliman | |
| 6,397,070 B1 | 5/2002 | Black | |
| 6,498,926 B1 | 12/2002 | Ciccarelli et al. | |
| 6,611,679 B1 | 8/2003 | Park et al. | |
| 7,068,743 B1 | 6/2006 | Suzuki | |
| 7,245,893 B1 * | 7/2007 | Husted et al. | ............ 455/226.3 |
| 7,248,847 B2 * | 7/2007 | Wallace et al. | ........... 455/232.1 |

(Continued)

FOREIGN PATENT DOCUMENTS

EP    0 814 568 A    12/1997

(Continued)

OTHER PUBLICATIONS

International Search Report: PCT/US2005/013178 (Aug. 29, 2005).

*Primary Examiner*—Lana N Le

(57) ABSTRACT

Accordingly, a system and method are provided for adaptively controlling amplification in a wireless communications device receiver. The method comprises: receiving a signal with a variable signal strength; amplifying the received signal in response to the signal strength, to supply an amplified signal. More specifically, amplifying the received signal in response to signal strength includes selecting a gain state in response to a plurality of signal strength switch point. The method further comprises: measuring signal quality; measuring signal energy; and, modifying a relationship between receiver performance and amplified signal strength, in response to the measured signal quality and measured signal energy. Other aspects of the method comprise processing the amplified signal, so that a processed signal quality and processed signal energy can be measured. Then, the relationship between receiver performance and amplified signal strength is modified in response the processed signal quality and the processed signal energy.

21 Claims, 3 Drawing Sheets

U.S. PATENT DOCUMENTS

| | | |
|---|---|---|
| 7,366,490 B2 * | 4/2008 | Rouphael et al. .......... 455/234.1 |
| 7,515,891 B2 * | 4/2009 | Darabi ..................... 455/250.1 |
| 2003/0012313 A1 | 1/2003 | Husted et al. |
| 2003/0139160 A1 * | 7/2003 | Yang ....................... 455/226.1 |
| 2003/0207674 A1 | 11/2003 | Hughes |
| 2004/0077324 A1 * | 4/2004 | Wieck ..................... 455/234.1 |
| 2004/0235439 A1 | 11/2004 | Husted et al. |
| 2005/0272390 A1 | 12/2005 | Rudberg |
| 2006/0018414 A1 | 1/2006 | Arkhipenkov et al. |
| 2009/0239491 A1 * | 9/2009 | Bargroff et al. .......... 455/234.1 |

FOREIGN PATENT DOCUMENTS

EP     1 326 347 A     7/2003

* cited by examiner

| SIGNAL STRENGTH (dBm) | SWITCH PT | GAIN (dB) | NF (dB) |
|---|---|---|---|
| -90 | 1 | 90 | 3 |
| -60 | 2 | 60 | 5 |
| -30 | 3 | 30 | 10 |
| 13 | 4 | -13 | 25 |

| SIGNAL STRENGTH (dBm) | SWITCH PT | GAIN (dB) | NF (dB) |
|---|---|---|---|
| -75 | 1 | 90 | 3 |
| -20 | 2 | 60 | 5 |
| 5 | 3 | 30 | 10 |
| 23 | 4 | -13 | 25 |

SYSTEM AND METHOD FOR ADAPTIVELY CONTROLLING RECEIVER GAIN SWITCH POINTS

CROSS-REFERENCE TO RELATED APPLICATION

This application is a division of application Ser. No. 10/829,806, claims priority to, and wholly incorporates by reference U.S. Pat. No. 7,248,847 filed on Apr. 22, 2004.

BACKGROUND OF THE INVENTION

1. Field of the Invention

This invention generally relates to communication receivers and, more particularly, to a system and method for adaptively controlling the gain switch points in a wireless communications receiver.

2. Description of the Related Art

FIG. 8 is a schematic block diagram illustrating a conventional wireless communications receiver (prior art). Ideally, a wireless communications device receives desired, inband communication signals at appropriate power levels. However, in practice, received signals often include undesired inband signals, referred to as jammers. Further, the receiver must have an adjustable gain to create appropriate power level signals for subsequent processing and demodulation. Jammers and inband communication signals with high power levels can cause distortion and intermodulation products when amplified. The linearity of, and conversely, the distortion in the receiver can be measured by the third order intercept point (IP3). Generally speaking, the higher the IP3, the more linear the amplifier operation. Alternately stated, the IP3 and linearity are improved by reducing gain through the amplifier.

On the other hand, a low power received signal must be amplified with a minimum of loss prior to the low noise amplifier (LNA) stage. Unfortunately, the gain reductions that are performed to minimize the creation of intermodulation products associated with jammers can work against the selection of optimal gain and noise figure needed to recover low power received signals Conventionally, a receiver LNA, attenuator, or mixer is set to operate in a series of predetermined gain states. Using the LNA of FIG. 8 as an example, the LNA may have four different gain states that are triggered solely in response to the total inband energy or power measured by the automatic gain control (AGC) circuit. For example, the LNA may be set to operate in a first gain state with a gain of 20 db, and a noise figure of 3 dB, in response to the AGC measuring a power level of −90 dBm or less. When the AGC measures greater than −90 dBm and less than −60 dBm for example, the LNA may be set to set to operate in a second gain state with a gain of 15 dB and a noise figure of 5 dB. In the above example, the LNA set points are −90 dBm and −60 dBm. The gain states are chosen in consideration of C/N or optimum receiver performance.

FIG. 9 is a graph showing the ratio of desired signal energy and total signal energy, or carrier to noise (C/N) ratio, plotted against input power (PIN) (prior art). Using code division multiplexed access (CDMA) telephone voice communications as an example, to hold frame error rate to 0.5% or less per 1,000 frames, the C/N of a receive signal must be kept above the −1 dB line shown in FIG. 9. The sudden spikes of degradation in C/N are associated with the above-mentioned LNA switch points.

Wide bandwidth telephone data applications are being developed, such as Internet access and video communications. Generally, the higher the C/N, the faster the wideband applications can be communicated. For example, in some circumstances, a 3 dB increase in the C/N doubles digital data carrying capacity.

As noted above, the trade off made between linearity and noise figure may limit receiver performance. This limitation may be acceptable in circumstances where only a minimum C/N is required, such as in conventional voice traffic. However, these limitations often prevent a receiver from being set to optimally process an intended signal. Alternately stated, a convention receiver design does not optimize the C/N ratio, as would be helpful in the communication of wideband data applications.

It would be advantageous if receiver performance could be adaptively modified to optimize the C/N for greater data communication capacity.

It would be advantageous if receiver performance could be controlled to optimize the discernable signal of interest of a signal with respect to the total inband power.

It would be advantageous if the receiver amplification set points be modified to adapt to changing receiving scenarios.

SUMMARY OF THE INVENTION

Accordingly, a system and method are provided for adaptively controlling amplification in a wireless communications device receiver. The method comprises: receiving a signal with a variable signal strength; amplifying the received signal in response to the signal strength, to supply an amplified signal. More specifically, amplifying the received signal in response to signal strength includes selecting a gain state in response to a signal strength switch point. Typically, a gain state is selected in response to a comparing the amplified signal strength to the plurality of switch points.

The method further comprises: measuring signal quality; measuring signal energy; and, modifying a relationship between receiver performance and amplified signal strength, in response to the measured signal quality and measured signal energy.

In some aspects, measuring signal quality includes: amplifying the received signal at a plurality of test gain states; measuring the inband energy for each test gain state; and, determining the test gain state associated with the minimum inband energy. Then, the relationship between receiver performance and amplified signal strength is modified in response to the determined gain state.

Other aspects of the method comprise processing the amplified signal, so that a processed signal quality and processed signal energy can be measured. Then, the relationship between receiver performance and amplified signal strength is modified in response the processed signal quality and the processed signal energy. For example, a discernable signal of interest can be measured with respect to the total inband power and the relationship between receiver performance and amplified signal strength is modified to optimize the discernable signal of interest.

The relationship between receiver performance and signal strength includes modifying a characteristic such as the linearity of the amplified signal, the noise figure of the amplified signal, the current draw associated with the amplified signal, or the gain of the amplified signal.

Additional details of the above-described method and a system for adaptively controlling amplification in a wireless communications device receiver are provided below.

DETAILED DESCRIPTION OF THE PREFERRED EMBODIMENTS

Figures 1, 2A, 2B:
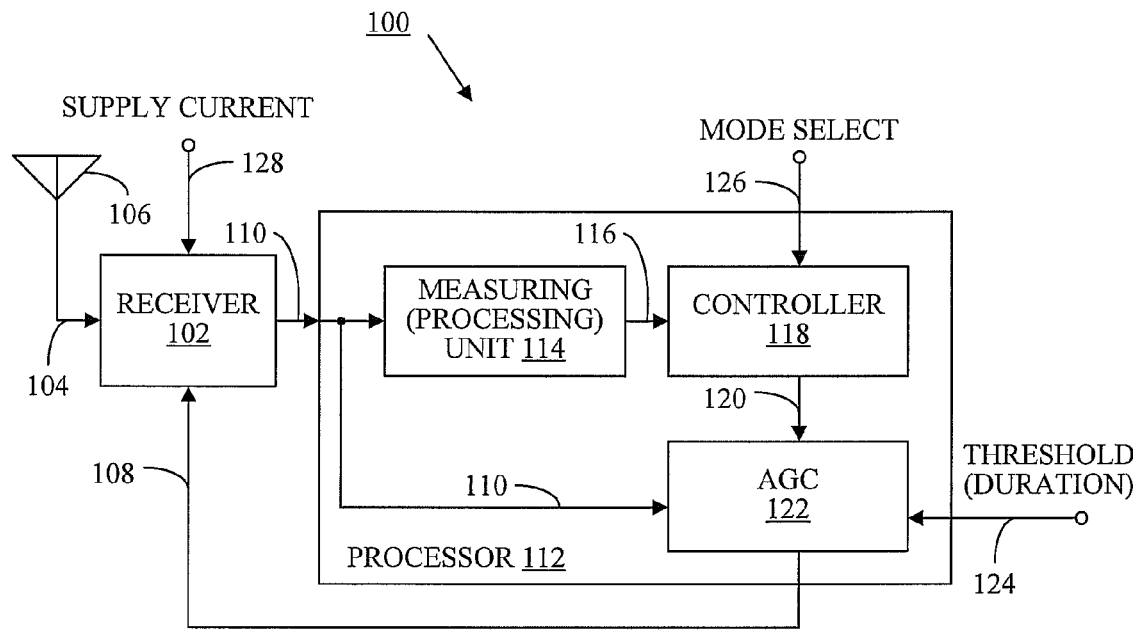
FIG. 1 is a schematic block diagram illustrating the present invention wireless communications device receiver system with adaptively controllable gain switch points.
FIGS. 2a and 2b are exemplary tables illustrating amplified signal strengths cross-referenced to signal strength switch points.

FIG. 1 is a schematic block diagram illustrating the present invention wireless communications device receiver system with adaptively controllable gain switch points. The system 100 comprises a receiver 102 having an input on line 104 to accept variable strength received signals. As shown, the signals are received on an antenna 106. As understood by one skilled in the art, other filter and transceiver switching elements (not shown) may be interposed between the antenna 106 and the receiver 102. The receiver 102 has an input on line 108 to accept gain state signals and an output on line 110 to supply a signal amplified in response to the gain state signals.

A processor 112 is shown that includes a measuring circuit 114 having an input on line 110 to accept the amplified signal. The measuring circuit 114 has an output on line 116 to supply an inband power measurement. A controller 118 has an output on line 120 to supply a control signal. The control signal is responsive to a determined signal quality, which is in turn, responsive to the inband power measurements on line 116. It should be understood that there may be multiple interpretations of the term "inband". As is understood by one skilled in the art, receiver filtering is typically graduated from wide to narrowband. That is, the receiver front-end filters are wider than subsequent filters in the system. Inband power, therefore, can be understood from the perspective of the front-end wideband filter, subsequent system narrow-band filters, or combinations of varying bandwidths. The system described herein can be understood using any of the above-mentioned contexts of "inband".

An automatic gain control (AGC) circuit 122 has an input on line 110 to accept the amplified signal and an input on line 120 to accept the control signal. The AGC circuit 122 has an output on line 108 that is connected to the receiver 102. The AGC circuit 122 supplies gain state signals responsive to the control signal on line 120 and amplified signal strength on line 110.

There are several mechanisms that can be used to derive signal quality from the inband power measurements on line 116. In one aspect, the AGC 122 generates a plurality of test gain states and the measuring circuit 114 supplies inband power measurements at the plurality of test gain states. The controller 118 determines the test gain state associated with the minimum inband power measurement and, in turn, supplies a control signal on line 120 in response to the determined (minimum inband power) gain state. The AGC circuit 122 modifies the gain state signals on line 108 in response to the control signal. The controller 118 makes an association between minimum inband power and optimum gain state based on the assumption that higher inband power levels are a result of the generation of intermodulation products. A further assumption is made that optimum performance can be achieved by improving the linearity of the amplified signal on line 110.

In some aspects, the AGC circuit 122 has an input on line 124 to accept a signal strength test threshold. The AGC circuit 122 initiates the test gain states in response a predetermined relationship between the received signal strength and the test threshold. For example, if a signal strength test threshold of −90 dBm is received on line 124, the AGC circuit 122 initiates the series of test states if the signal strength of the amplified signal on line 110 exceeds the −90 dBm. To continue the example, the AGC circuit 122 may send signals to have the receiver operate at four different gain states, such as 90 dB, 60 dB, 30 dB, and −13 dB.

In other aspects, the AGC circuit input on line 124 may accept a test interval duration. Then, the AGC circuit 122 initiates a set of test gain states in response to waiting a duration of time equal to the test interval. That is, the AGC circuit 122 initiates a set of test gain states in response to waiting a test interval duration since a previous set of tests. For example, a test may be initiated every minute. Alternately, the AGC circuit 122 initiates a set of test gain states in response to waiting a test interval duration since a change in received signal strength. For example, the test can be initiated one second after an event such as the measurement of a −90 dBm amplified signal on line 110. In other aspects, the controller 118 may measure a change in inband power, and the AGC circuit 122, in turn, initiates a set of test gain states in response to waiting a test interval duration since the measured change of inband power.

In some aspects of the system 100, the measuring unit 114 is a processing unit supplying a processed signal on line 116. A processes signal as used herein is typically a broadband signal that has been recovered from the carrier frequency. The recovered broadband signal may undergo further operations to recover transmitted information. The controller 118 accepts the processed signal on line 116 and supplies a control signal on line 120 that is responsive to measuring the processed signal quality and processed signal energy.

FIGS. 2a and 2b are exemplary tables illustrating amplified signal strengths cross-referenced to signal strength switch points. As in a conventional system, the AGC circuit 122 supplies one of a plurality of gain control signals selected in response to comparing the amplified signal strength with a corresponding plurality of signal strength switch points. However, unlike conventional systems, the AGC circuit 122 modifies the relationship between the receiver performance and the switch points in response to the control signals. In response to receiving a control signal on line 120, the AGC circuit 122 uses the table of FIG. 2b, instead or the table of FIG. 2a. Alternately stated, the AGC circuit modifies that relationship between the switch points and the signal strength levels that trigger the switch points.

Returning to FIG. 1, in some aspects of the system 100, the controller 118 measures a discernable signal of interest with respect to the total inband power, and supplies control signals on line 120 to optimize the discernable signal of interest. That is, the AGC circuit 122 modifies that relationship between the performance of the receiver 102 and the amplified signal strength measured on line 110.

In other aspects, the receiver 102 accepts a communication signal on line 104 modulated with a carrier signal. Then, the controller 118 measures a carrier to noise (C/N) ratio and supplies a control signal on line 120 to optimize the carrier level. In some aspects, the receiver 102 accepts a communication signal on line 104 spread with an orthogonal code. Then, the controller 118 measures a correlatable signal of interest and supplies a control signal on line 120 to optimize the signal correlation. For example, the receiver 102 may receive CDMA telephone communications and the controller 118 may generate a control signal on line 120 to optimizing the recovery of despread chips.

In some aspects of the system 100, the controller 118 has an additional input on line 126 to accept a mode signal. The mode signal indicates whether the system 100 is operating on either voice or data traffic. For example, the controller 118 may supply a control signal on line 120 to modify gain states in response to receiving a data mode signal. Alternately, the controller 118 supply a control signal that locks gain states, so that the receiver operates conventionally, in response to receiving a voice mode signal on line 126. Note that the system 100 may be operated to modify gain states even when voice traffic is being received.

The ability of the AGC circuit 122 to change the switch points at which the receiver is operating directly affects the receiver performance and the amplified signal on line 110. More specifically, the receiver performance perimeters that are affected by changing the relationship between signal strength (on line 110) and the switch points include the linearity of the amplified signal, the noise figure associated with the amplified signal, and the overall gain of the amplified signal. In some aspects, the receiver 102 has an input on line 128 to accept power supply current. The receiver 102 modifies supply current levels in response the AGC circuit 122 changing the relationship between the signal strength and switch points.

Figure 3:
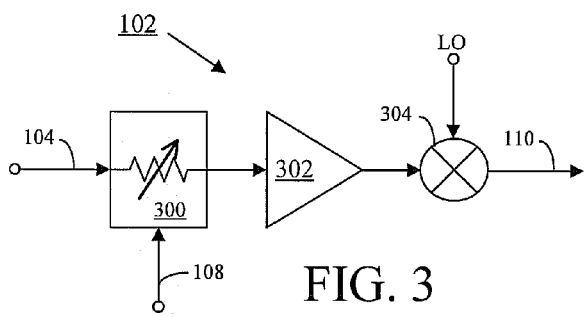
FIG. 3 is a schematic block diagram exemplifying the receiver of FIG. 1 in greater detail.

FIG. 3 is a schematic block diagram exemplifying the receiver 102 of FIG. 1 in greater detail. As shown, the receiver includes an adjustable loss attenuator 300 and a constant gain amplifier 302. The gain states mentioned in the explanation of FIG. 1 more specifically correspond to predetermined loss states (negative gain states) through the attenuator 300. Shown is a zero intermediate frequency (ZIF) design that uses a mixer 304 to downconvert the received signal directly to a broadband amplified signal on line 110. Alternately but not shown, the receiver may use 2 mixers and 2 local oscillator frequencies to achieve down conversion. Further, the receiver 102 may include additional filtering between elements that is also not shown.

Figure 4:
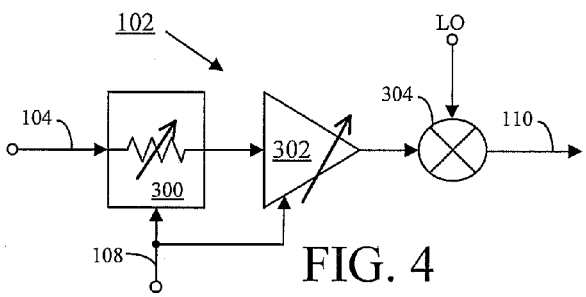
FIG. 4 is a schematic block diagram exemplifying a second aspect of the receiver of FIG. 1 in greater detail.

FIG. 4 is a schematic block diagram exemplifying a second aspect of the receiver 102 of FIG. 1 in greater detail. FIG. 4 is similar to FIG. 3, except that the amplifier 302 has an adjustable gain low noise amplifier. Then, changes in gain state are achieved in response to modifying the loss through the attenuator 300 while simultaneously modifying the gain through the amplifier 302. Note that in other aspects not shown, the attenuator 300 is not present and the changes in gain state are accomplished through changing just the gain of the amplifier 302.

Figure 5:
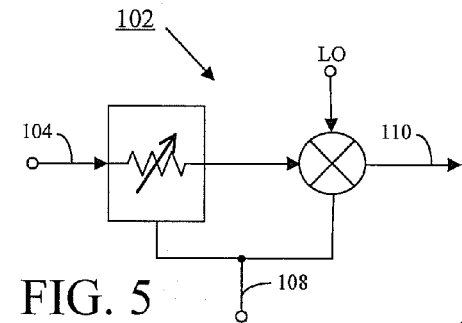
FIG. 5 is a schematic block diagram exemplifying a third aspect of the receiver of FIG. 1 in greater detail.

FIG. 5 is a schematic block diagram exemplifying a third aspect of the receiver 102 of FIG. 1 in greater detail. In this aspect, the mixer 304 is an adjustable gain low noise amplifier. As shown, the mixer is preceded by attenuator 300 and the changes in gain state are accomplished by changing the mixer gain and the attenuator loss.

Figure 6:
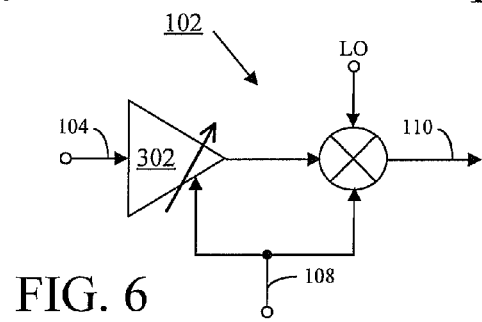
FIG. 6 is a schematic block diagram exemplifying a fourth aspect of the receiver of FIG. 1 in greater detail.

FIG. 6 is a schematic block diagram exemplifying a fourth aspect of the receiver 102 of FIG. 1 in greater detail. In this aspect, the mixer 304 is an adjustable loss mixer. Changes in gain state are accomplished by changing the gain through amplifier 302 and the loss through mixer 304. Note that FIGS. 3 through 6 illustrate only a few ways of implementing a receiver design. Many other designs, or variations of the above-mentioned designs, could be created by those skilled in the art to enable the system of FIG. 1.

Functional Description

Returning to FIG. 1, the system 100 is described in operation. In one example of operation the receiver 102 accepts a first signal on line 104 with a signal strength increasing over time. For example, the receiver 102 may be a telephone that is approaching a base station. Likewise, in a situation such as when the telephone is moving away from the base station, the receiver would receive a second signal with a signal strength that decreases over time. The AGC circuit 122 supplies a first plurality of switch points in response to the first signal and a second plurality of switch points, different than the first plurality of switch points, responsive to the second signal. Such a mechanism helps prevent the receiver from hysteresis. Note that both the first and second plurality of switch points can be independently modified.

In another example of operation, the AGC circuit 122 supplies a first gain state signal to the receiver 102 on line 108, responsive to a relationship between a first signal strength and a first switch point. For example (using the table of FIG. 2a) the receiver may be operating at a gain of 90 dB in response to a signal strength of −91 dBm, where the closest switch point is −90 dBm.

The AGC circuit 122 subsequently measures a second signal strength, for example at −80 dBm. Conventionally, the receiver 102 would change gain states in response to moving through the −90 dBm switch point. However, the controller 118 of system 100 measures a first ratio of discernable signal of interest to total inband power responsive to the first signal strength and the first gain state. For example, the first ratio may be 3 dB. In this example, the controller continues to measures the first ratio responsive to the second signal strength and the first gain state. In response to these measurements, the controller 118 supplies a control signal on line 120 to modify the first switch point. The AGC circuit 122 supplies a signal on line 108 to maintain the first gain state in response to modifying the first switch point. For example, the AGC circuit 122 may change the first switch point from −90 dBm to −75 dBm, so that when the signal strength on line 110 changes from −91 dBm to −80 dBm, the 90 db receiver gain state is maintained.

Note that the second measurement of ratio need not necessarily be exactly the same as the first ratio in order to maintain a gain state. For example, the first measurement can be 3 dB and the second measurement can be 3.5 or 2.75, as the first ratio can be defined to include a tolerance range. Alternately, a subsequently measured ratio that is at least as good as the first ratio may be defined as the first ratio.

In another example of operation, the AGC circuit 122 supplies a first gain state signal to the receiver 102 that is responsive to a relationship between a first signal strength and a first switch point. As in the above example, the signal strength on line 110 is −91 dBm and the first switch point is −90 dBm. This example assumes that the receiver will change gain states if the signal strength exceeds the first switch point. The controller 118 measures a measures a first ratio of discernable signal of interest to total inband power, less than a minimum threshold ratio, responsive to the first signal strength and the first gain state. The controller 118 supplies a control signal on line 120 to modify the first switch point. The AGC circuit 122 supplies a signal to establish a second gain state response to modifying the first switch point.

For example, the threshold ratio may be 3 dB or higher. In response to measuring a first ratio of 2 dB the controller generates a control signal to modify the first switch point even though the amplified signal strength on line 110 has remained constant. To continue the example, the controller may direct the AGC to change the first switch point to −95 dBm, which will cause the receiver to go from the first gain state of 90 dB, to a second gain state of 60 dB.

Figure 7:
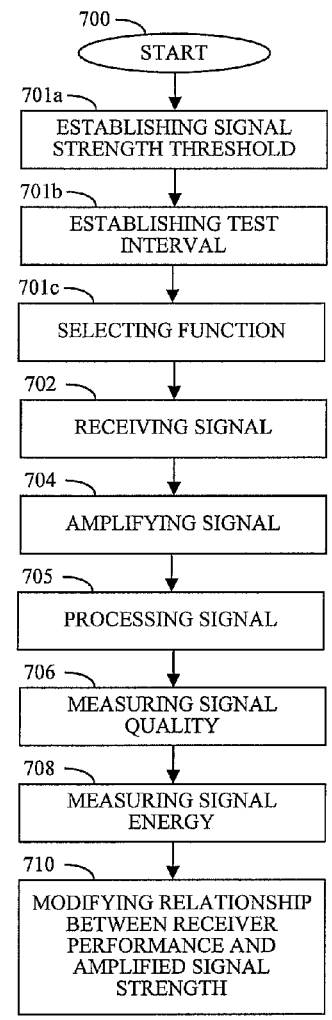
FIG. 7 is a flowchart illustrating the present invention method for adaptively controlling amplification in a wireless communications device receiver.
Figure 8:
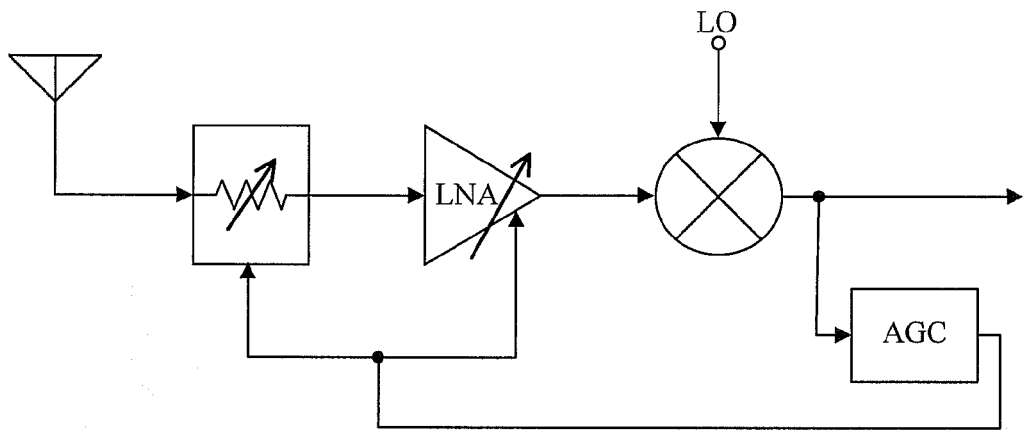
FIG. 8 is a schematic block diagram illustrating a conventional wireless communications receiver (prior art).
Figure 9:
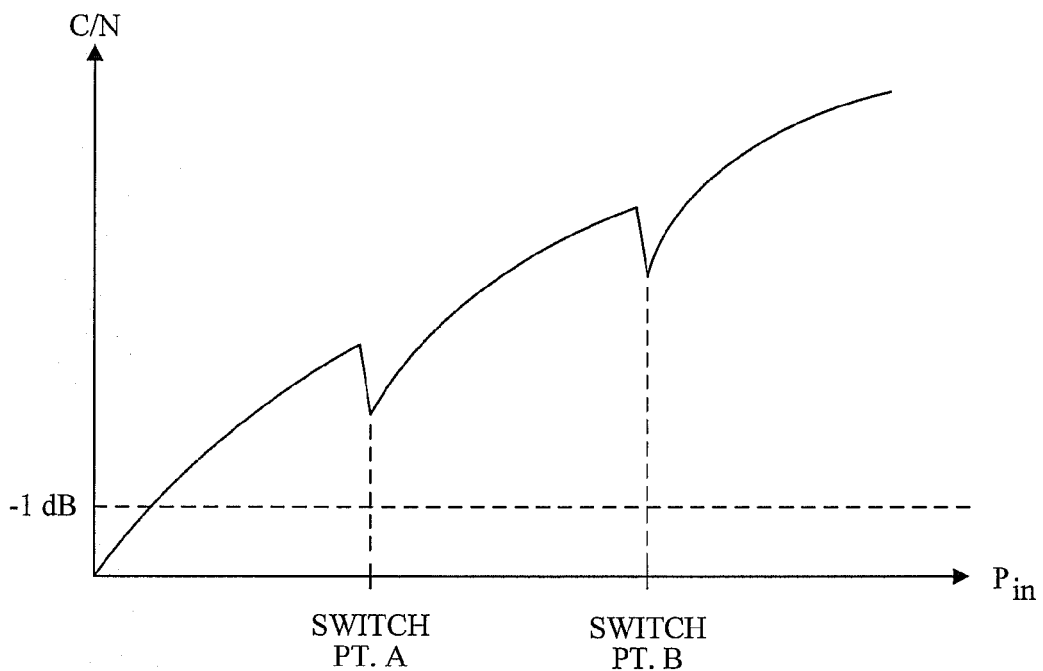
FIG. 9 is a graph showing the ratio of desired signal energy and total signal energy, or carrier to noise (C/N) ratio, plotted against input power (PIN) (prior art).

FIG. 7 is a flowchart illustrating the present invention method for adaptively controlling amplification in a wireless communications device receiver. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 receives a signal with a variable signal strength. Step 704 amplifies the received signal in response to the signal strength, to supply an amplified signal. Step 706 measures signal quality. Step 708 measures signal energy. Step 710 modifies a relationship between receiver performance and amplified received signal strength, in response to the measured signal quality and measured signal energy. This aspect of the method is generally the same as the system of FIG. 1, where the system was enabled with a measuring circuit (reference designator 114).

In some aspects of the method, measuring signal quality in Step 706 includes substeps (not shown). Step 706a generates a plurality of test gain states. Step 706b measures the inband energy for each test gain state. Step 706c determines the test gain state associated with the minimum inband energy. Then, modifying a relationship between receiver performance and received signal strength in Step 710 includes modifying the relationship in response to the determined (minimum inband energy) gain state.

In other aspects, a further step, Step 701a, establishes a signal strength test threshold. Then, generating a plurality of test gain states in Step 706a includes initiating the testing in response a predetermined relationship between the received signal strength and the test threshold. Alternately, Step 701b establishes a test interval. Then, generating a plurality of test gain states in Step 706a includes initiating a set of test gain states in response to waiting a duration of time equal to the test interval.

Some examples of wait duration test initiations were given above in the explanation of FIG. 1. In some aspects, Step 706a initiates a set of test gain states in response to waiting a test interval duration since a previous set of tests. In other aspects, a set of test gain states is initiated in response to waiting a test interval duration since a change in amplified signal strength. In yet another aspect, a set of test gain states is initiated in response to waiting a test interval duration since a change in measured inband energy.

Another aspect of the method involves the use of a processed received signal, generally corresponding to the description of the processing unit (reference designator 114) of FIG. 1. The method includes a further step, Step 705, of processing the amplified signal (of Step 704). Then, measuring signal quality (Step 706) includes measuring the processed signal quality, and measuring signal energy (Step 708) includes measuring the processed signal energy. Modifying the relationship between amplification and signal strength in Step 710 includes modifying the relationship in response to the processed signal quality and the processed signal energy.

In some aspects of the method, modifying the relationship between receiver performance and signal strength in Step 710 includes modifying the linearity of the amplified signal. Alternately, or additionally, Step 710 includes modifying the noise figure of the amplified signal, modifying the current draw associated with the amplified signal, and/or modifying the gain of the amplified signal.

In some aspects, amplifying the received signal in response to signal strength in Step 704 includes selecting a gain state in response to an amplified signal strength switch point. Then, modifying the relationship between receiver performance and signal strength in Step 710 includes modifying the switch point. Typically, Step 704 comparing the amplified signal strength to the plurality of switch points.

In other aspects, measuring the processed signal quality (Step 706) and the processed signal energy (Step 708) includes measuring the discernable signal of interest with respect to the total inband power. Then, modifying the relationship between receiver performance and signal strength (Step 710), in response to the processed signal quality and processed signal energy, includes modifying the relationship to optimize the discernable signal of interest.

In a different aspect, receiving a signal with a variable signal strength in Step 702 includes receiving a communication signal modulated with a carrier signal. Measuring the discernable signal of interest with respect to the total inband power (Step 706/708) includes measuring the carrier to noise ratio (C/N). In other aspects, receiving a signal with a variable signal strength in Step 702 includes receiving an orthogonally spread communication signal. Then, measuring the discernable signal of interest with respect to the total inband power includes measuring correlatable signals of interest.

In one aspect of the method a further step, Step 701c, selects a communication function, such as voice or data communications. Note that data communications may be further differentiated into different class of service (COS) categories. Then, modifying the relationship between receiver performance and amplified signal strength (Step 710), in response to the processed signal quality and processed signal energy, includes substeps (not shown). Step 710a enables the modification process in response to selecting data communications. Alternatively, in Step 710b the modification process is not enables in response to selecting voice communications. Note that in other aspects of the method, the advantages inherent in using the receiver performance modification method can also be applied to voice traffic.

In some aspects, amplifying the received signal in response to the signal strength in Step 704 includes a process such as amplifying the received signal with positive gain, attenuating the received signal, frequency-converting and amplifying the received signal with positive gain, and/or frequency-converting and attenuating the received signal. See the discussion of FIGS. 3-6, above.

Some aspects of the method include a mechanism to prevent hysteresis. Receiving a signal with a variable signal strength in Step 702 includes receiving a signal with signal strength increasing with time. Then, selecting a gain state in response to a signal strength switch point in Step 704 includes comparing the measured signal strength of the first signal to a first plurality of switch points. Alternately, Step 702 receives a signal with signal strength decreasing with time, and Step 704 compares the measured signal strength of the second signal to a second plurality of switch points, different than the first plurality.

In one aspects of the method, comparing the amplified signal strength to a plurality of switch points in Step 704 includes comparing a first signal strength at a first time, and selecting a first gain state in response to a relationship between the first signal strength and a first switch point. Steps 706/708 measure a first ratio of discernable signal of interest with respect to the total inband power, responsive to the first signal strength and the first gain state. At a second time, Step 704 measuring a second signal strength, different than the first signal strength. However, Steps 706/708 continue to measure the first ratio, which is now responsive to the second signal strength and the first gain state. Because the first ratio is maintained, despite a change in received signal power, Step 710 modifies the first switch point so that Step 704 selects (maintains) the first gain state in response to the relationship between the second signal strength and the modified first switch point.

In a different example, Step 704 compares a first amplified signal strength to a plurality of switch points at a first time and selects a first gain state in response to a relationship between the first signal strength and a first switch point. Step 706/708 measures a first ratio of discernable signal of interest with respect to the total inband power, less than a minimum threshold ratio, or less than a previously measured ratio, responsive to the first signal strength and the first gain state. Step 710 modifies the first switch point. In response, Step 704 selects a second gain state in response to the relationship between the first signal strength and the modified first switch point.

A system and method for adaptively controlling amplification in a wireless communications device receiver have been provided. Some examples have been given of specific receiver designs, however, the invention is not limited to merely these examples. Other examples have been given of scenarios and the reaction of the invention to these scenarios. Again the invention is not limited to these examples. The invention has been presented in the context a wireless telephone, especially a CDMA protocol telephone, however, it should be understood that invention has application to hard-wired and optical type receivers. Other variations and embodiments of the invention will occur to those skilled in the art.

We claim:

1. A method for adaptively controlling amplification in a wireless communications device receiver, the method comprising:
   receiving a signal with a variable signal strength;
   amplifying the received signal in response to the signal strength, to supply an amplified signal;
   measuring signal quality in which measuring signal quality includes
      generating a plurality of test gain states;
      measuring the inband energy for each test gain state; and,
      determining the test gain state associated with the minimum inband energy; and,
   measuring signal energy; and,
   modifying a relationship between receiver performance and amplified signal strength, in response to the measured signal quality and measured signal energy wherein modifying a relationship between receiver performance and amplified signal strength, in response to the measured signal quality and measured signal energy, includes modifying the relationship in response to the determined gain state.

2. The method of claim 1 further comprising:
   establishing a signal strength test threshold; and, wherein generating a plurality of test gain states includes initiating the testing in response a predetermined relationship between the amplified signal strength and the test threshold.

3. The method of claim 1 further comprising:
   establishing a test interval; and, wherein generating a plurality of test gain states includes initiating a set of test gain states in response to waiting a duration of time equal to the test interval.

4. The method of claim 3 wherein initiating a set of test gain states in response to waiting a test interval duration includes waiting a test interval duration since a previous set of tests.

5. The method of claim 3 wherein initiating a set of test gain states in response to waiting a test interval duration includes waiting a test interval duration since a change in received signal strength.

6. The method of claim 3 wherein initiating a set of test gain states in response to waiting a test interval duration includes waiting a test interval duration since a change in measured inband energy.

7. The method of claim 1 further comprising: processing the amplified signal; and, wherein measuring signal quality includes measuring the processed signal quality; wherein measuring signal energy includes measuring the processed signal energy; and, wherein modifying the relationship between receiver performance and amplified signal strength, in response to the measured signal quality and measured signal energy, includes modifying the relationship in response to the processed signal quality and the processed signal energy.

8. The method of claim 7 wherein amplifying the received signal in response to signal strength includes selecting a gain state in response to an amplified signal strength switch point; and, wherein modifying the relationship between receiver performance and amplified signal strength, in response to the processed signal quality and processed signal energy, includes modifying the switch point.

9. The method of claim 1 wherein amplifying the received signal in response to the amplified signal strength includes a process selected from the group including amplifying the received signal with positive gain, attenuating the received signal, frequency-converting and amplifying the received signal with positive gain, and frequency-converting and attenuating the received signal.

10. A method for adaptively controlling amplification in a wireless communications device receiver, the method comprising:
   receiving a signal with a variable signal strength;
   amplifying the received signal in response to the signal strength, to supply an amplified signal;
   measuring signal quality;
   measuring signal energy;
   modifying a relationship between receiver performance and amplified signal strength, in response to the measured signal quality and measured signal energy; and
   processing the amplified signal; and, wherein measuring signal quality includes measuring the processed signal quality; wherein measuring signal energy includes measuring the processed signal energy; and, wherein modifying the relationship between receiver performance and amplified signal strength, in response to the measured signal quality and measured signal energy, includes modifying the relationship in response to the processed signal quality and the processed signal energy, and wherein amplifying the received signal in response to signal strength includes selecting a gain state in response to an amplified signal strength switch point; and, wherein modifying the relationship between receiver performance and amplified signal strength, in response to the processed signal quality and processed signal energy, includes modifying the switch point, and wherein measuring the processed signal quality and the processed signal energy includes measuring the discernable signal of interest with respect to the total inband power; and, wherein modifying the relationship between receiver performance and amplified signal strength, in response to the processed signal quality and processed signal energy, includes modifying the relationship to optimize the discernable signal of interest.

11. The method of claim 10 wherein receiving a signal with a variable signal strength includes receiving a communication signal modulated with a carrier signal; and, wherein measuring the discernable signal of interest with respect to the total inband power includes measuring the carrier to noise ratio (C/N).

12. The method of claim 10 wherein receiving a signal with a variable signal strength includes receiving an orthogonally spread communication signal; and, wherein measuring the discernable signal of interest with respect to the total inband power includes measuring correlatable signals of interest.

13. The method of claim 10 further comprising: selecting a communication function selected from the group including voice and data communications; and, wherein modifying the relationship between receiver performance and amplified signal strength, in response to the processed signal quality and processed signal energy, includes: enabling the modification process in response to selecting data communications; and, not enabling the modification process in response to selecting voice communications.

14. The method of claim 10 wherein selecting a gain state in response to a signal strength switch point includes comparing the amplified signal strength to the plurality of switch points.

15. The method of claim 14 wherein comparing the amplified signal strength to a plurality of switch points includes: comparing a first signal strength at a first time; selecting a first gain state in response to a relationship between the first signal strength and a first switch point; wherein measuring the discernable signal of interest with respect to the total inband power includes measuring a first ratio, responsive to the first signal strength and the first gain state; wherein comparing the amplified signal strength to a plurality of switch points includes comparing a second signal strength, different than the first signal strength, at a second time; wherein measuring the discernable signal of interest with respect to the total inband power includes measuring the first ratio responsive to the second signal strength and the first gain state; wherein modifying the relationship between receiver performance and amplified signal strength includes modifying the first switch point; and, wherein selecting a gain state in response to a signal strength switch point includes selecting the first gain state in response to the relationship between the second signal strength and the modified first switch point.

16. The method of claim 14 wherein comparing the amplified signal strength to a plurality of switch points includes: comparing a first signal strength at a first time; and, selecting a first gain state in response to a relationship between the first signal strength and a first switch point; wherein measuring the discernable signal of interest with respect to the total inband power includes measuring a first ratio, less than a minimum threshold ratio, responsive to the first signal strength and the first gain state; wherein modifying the relationship between receiver performance and amplified signal strength includes modifying the first switch point; and, wherein selecting a gain state in response to a signal strength switch point includes selecting a second gain state in response to the relationship between the first signal strength and the modified first switch point.

17. The method of claim 14 wherein modifying the relationship between receiver performance and amplified signal strength includes modifying the linearity of the amplified signal.

18. The method of claim 14 wherein modifying the relationship between receiver performance and amplified signal strength includes modifying the noise figure of the amplified signal.

19. The method of claim 14 wherein modifying the relationship between receiver performance and amplified signal strength includes modifying the current draw associated with the amplified signal.

20. The method of claim 14 wherein modifying the relationship between receiver performance and amplified signal strength includes modifying the gain of the amplified signal.

21. A method for adaptively controlling amplification in a wireless communications device receiver, the method comprising:

receiving a signal with a variable signal strength;

amplifying the received signal in response to the signal strength, to supply an amplified signal;

measuring signal quality;

measuring signal energy;

modifying a relationship between receiver performance and amplified signal strength, in response to the measured signal quality and measured signal energy; and processing the amplified signal; and, wherein measuring signal quality includes measuring the processed signal quality; wherein measuring signal energy includes measuring the processed signal energy; and, wherein modifying the relationship between receiver performance and amplified signal strength, in response to the measured signal quality and measured signal energy, includes modifying the relationship in response to the processed signal quality and the processed signal energy, and wherein amplifying the received signal in response to signal strength includes selecting a gain state in response to an amplified signal strength switch point; and, wherein modifying the relationship between receiver performance and amplified signal strength, in response to the processed signal quality and processed signal energy, includes modifying the switch point, and wherein measuring the processed signal quality and the processed signal energy includes measuring the discernable signal of interest with respect to the total inband power; and, wherein modifying the relationship between receiver performance and amplified signal strength, in response to the processed signal quality and processed signal energy, includes modifying the relationship to optimize the discernable signal of interest, and wherein selecting a gain state in response to a signal strength switch point includes comparing the amplified signal strength to the plurality of switch points, and, wherein receiving a signal with a variable signal strength includes receiving a signal with signal strength increasing with time;

wherein selecting a gain state in response to a signal strength switch point includes comparing the amplified signal strength of the first signal to a first plurality of switch points; wherein receiving a signal with a variable signal strength includes receiving a second signal with signal strength decreasing with time; and, wherein selecting a gain state in response to a signal strength switch point includes comparing the measured signal strength of the second signal to a second plurality of switch points, different than the first plurality.

* * * * *